March 12, 1935. A. W. BARBER Re. 19,493

AUDION AMPLIFIER

Original Filed Feb. 12, 1931 2 Sheets-Sheet 1

Inventor:
Alfred W. Barber,
By Byrnes, Townsend & Potter,
Attorneys.

March 12, 1935. A. W. BARBER Re. 19,493

AUDION AMPLIFIER

Original Filed Feb. 12, 1931 2 Sheets-Sheet 2

Inventor:

Alfred W. Barber,

By Byrnes, Townsend & Potter,

Attorneys.

Reissued Mar. 12, 1935 Re. 19,493

UNITED STATES PATENT OFFICE 19,493

AUDION AMPLIFIER

Alfred W. Barber, Flushing, N. Y., assignor to Radio Corporation of America, New York, N. Y., a corporation of Delaware Original No. 1,903,542, dated April 11, 1933, Serial No. 515,347, February 12, 1931. Application for reissue October 11, 1933, Serial No. 693,197

16 Claims. (Cl. 250—20)

This invention relates to audion amplifiers and more particularly to improved methods of and circuit arrangements for automatically controlling the gain of the amplifier.

In the reception of modulated carrier wave signals, it is desirable to operate the high frequency amplifier at maximum sensitivity so long as the received signal energy is insufficient to produce a predetermined input voltage across the detector, and to reduce the sensitivity of the amplifier for stronger signals at such rate that the detector input remains substantially constant. Some types of automatic gain control, and particularly those employing a diode both as a demodulator of the received signal and as the rectifier for producing a direct current gain control voltage, are open to the disadvantage that the sensitivity is automatically reduced for all signal inputs above the threshold value which will actuate the receiver, thus defeating the purpose of the automatic gain control which is to obtain a constant output level over the widest possible range of received signal energy.

Objects of the present invention are to provide methods of and circuit arrangements for automatic gain control which are characterized by the substantial postponement of a reduction in sensitivity until the received signal energy has risen to the value corresponding, at maximum sensitivity, to the desired output level. Further objects are to provide methods of and circuit arrangements for opposing the effects of the automatic gain control voltage produced during reception of signals of relatively low magnitude.

More particularly, objects are to provide methods of and circuit arrangements for automatically controlling the gain of an amplifier by the use of two biasing potentials which vary automatically with received signal energy; the effects of the two bias potentials being in opposition and substantially nullifying each other for all signals of a magnitude less than that effective, at maximum sensitivity, to produce normal output.

Figure 1:
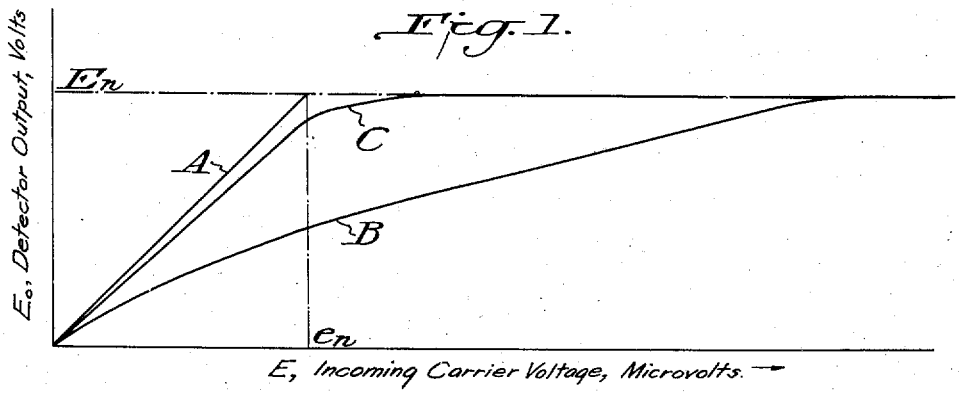
Figure 2:
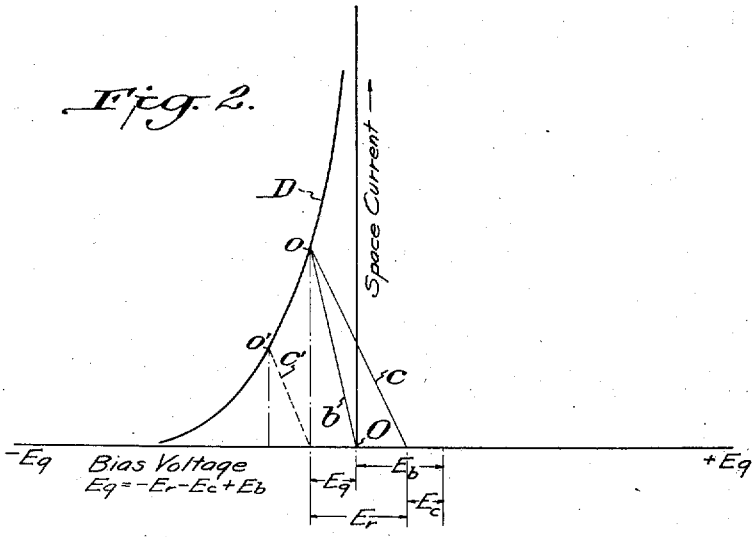
Figure 3:
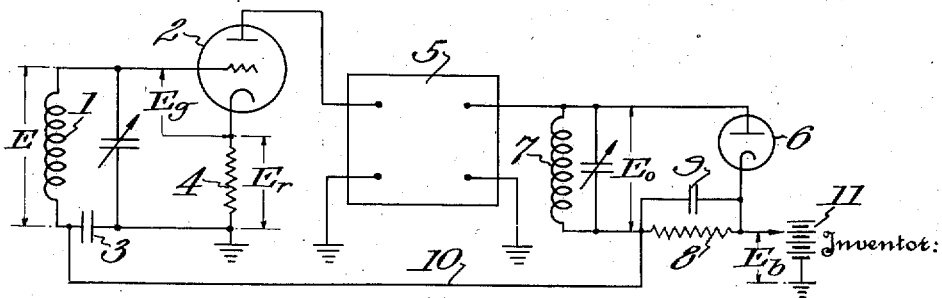
Figure 4:
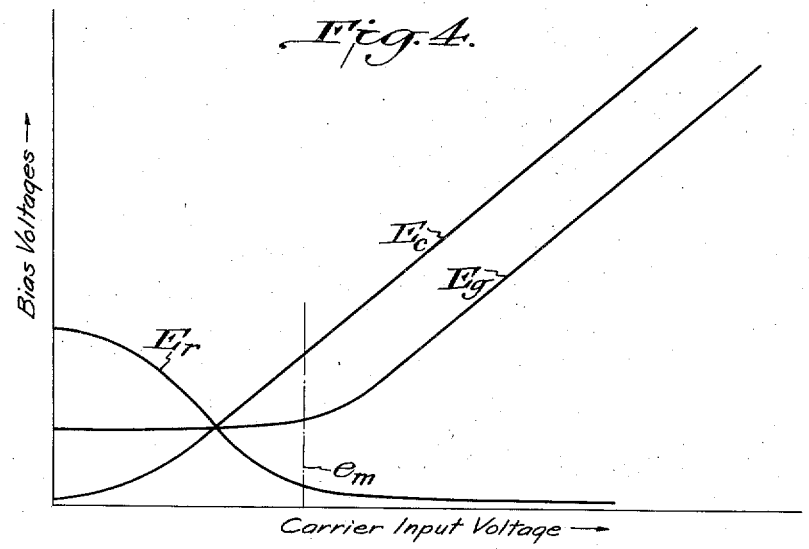
Figure 5:
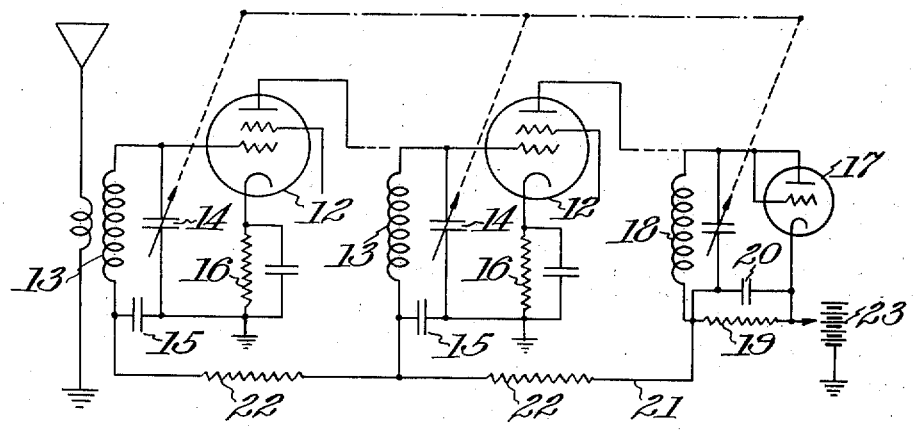

These and other objects of the invention will be apparent from the following specification when taken with the accompanying drawings, in which Fig. 1 is a curve sheet showing the relationship between amplifier input and output for an ideal gain control system, and the relationship actually obtained with one embodiment of the invention, Fig. 2 is an explanatory diagram based upon the voltage-current characteristic of an audion amplifier, Fig. 3 is a schematic circuit diagram of one form of gain control system constructed in accordance with the invention, Fig. 4 is a curve sheet showing the variations, with carrier wave voltage, of the automatic bias potentials, and Fig. 5 is a circuit diagram of one embodiment of the invention.

As usually understood in connection with radio receivers, an automatic volume or automatic gain control would, if ideal operation obtains, maintain maximum sensitivity so long as the received signal energy was insufficient to raise the detector input voltage to a predetermined or normal level, and would reduce the sensitivity as the signal energy increased beyond that critical value, the decrease in sensitivity for increasing signal strength being at such rate that the detector input remained substantially constant.

In Fig. 1, the curve A represents the relationship which would exist between the amplifier input and output voltage if an ideal automatic gain control were employed. As the incoming carrier voltage E increases from its threshold value, the amplifier gain should remain constant at its maximum value until the incoming signal reaches that value $e_n$ which brings the detector input voltage $E_o$ to the predetermined value $E_n$ at which the receiver is to be operated. In other words, the amplifier output should be proportional to the input for all signals below the "normal" signal input voltage which, at maximum sensitivity, corresponds to "normal" amplifier output or detector input voltage. For all higher signal voltages, the amplifier output should remain constant.

Curve B shows the relationship existing between amplifier input E and amplifier output $E_o$ in one known form of automatic gain control system in which a diode serves both as the signal demodulator and the source of automatic gain control potential. A comparison of curves A and B demonstrates that such systems do not satisfy the essential requirements of a gain control which, over a wide range of impressed signal voltages, will maintain constant output, since the output does not reach its intended or normal value $E_n$ until the signal voltage rises to a very high value.

Systems of this old type limit the output to values much less than proportional to input for all signals, and their operation is not characterized by a quick rise to normal output, followed by constant output, as the signal voltage is increased.

In accordance with the present invention, the sensitivity of the amplifier may be kept approximately constant until the carrier input reaches its normal value $e_n$, and the normal output voltage $E_n$ is reached at somewhat greater carrier input. The curve C of Fig. 1 illustrates the control obtained with one embodiment of the invention, and it will be noted that this curve is a close approximation to the ideal operating characteristic A.

To defer the reduction in sensitivity, use is made of two bias potentials which vary automatically with signal strength and which for any given change in signal strength tend to change the amplifier gain in the opposite sense.

One bias potential is obtained, in the known manner, by rectification of the carrier and this direct current voltage increases as a substantially linear function of the carrier when, as is the usual case, a linear rectifier is employed. The other component of the control potential comprises the direct current drop across a resistor in that part of the cathode circuit which is common to the grid and plate circuits of the controlled amplifier, i. e., an auto- or cathode bias. Although the cathode bias potential does not vary as a direct result of changing carrier wave energy, its magnitude is dependent, at least in part, upon the magnitude of the rectifier bias potential which varies automatically with signal strength.

The relative effects of these two bias potentials will be apparent from a consideration of the amplifier voltage-current characteristic, Fig. 2, and the circuit diagram, Fig. 3. The curve D of Fig. 2 shows the relationship between grid bias $E_g$ and space current I for an amplifier tube and, as shown in Fig. 3, the effective grid bias potential $E_g$ is determined by the algebraic sum of three components, two of which vary automatically with signal strength.

As shown diagrammatically in Fig. 3, the input circuit 1 of the amplifier tube 2 is connected to the tube grid and, through a blocking condenser 3, to ground. The resistor 4 is connected between the tube cathode and ground, and therefore the direct current potential established across this resistor by the space current flow provides a bias potential effective between the amplifier grid and cathode. The plate circuit of tube 2 is connected by a network 5, (which may be simply an interstage coupling or may include additional amplifiers) to the plate of the diode rectifier 6. The circuit between the diode plate and cathode includes the radiofrequency circuit 7 and the resistance 8 which is by-passed for radiofrequency currents by a condenser 9. A lead 10 connects the low potential terminal of the amplifier input circuit 1 to that end of resistance 8 which is spaced from the diode cathode, and the latter is connected to ground through a battery 11. No filter network is shown for eliminating audio or radiofrequency components from the direct current bias potential feed back to amplifier 1 since the exact form of such network has no bearing upon the theory of operation of the gain control system.

In the absence of any signal voltage E across amplifier input, the bias $E_g$ between the amplifier grid is:

$$E_g = -E_r - E_c + E_b,$$

where $E_r$ is the potential drop due to the flow of space current through the cathode bias resistor 4, $E_c$ is the potential drop arising from the flow of space current in the diode, and $E_b$ is the voltage across that portion of battery 11 which is between the diode cathode and ground.

Referring now to Fig. 2, the point *o* on curve D is the operating point for maximum sensitivity of the amplifier tube, and operation about this point of the characteristic is effected by the application of a negative bias voltage $e_g$. As is well known, the slope of a line *b* drawn through point *o* and the origin O gives the magnitude of the resistance 4 which would, for space current flow corresponding to point *o*, give a cathode bias potential of $e_g$.

In accordance with the invention, the cathode bias resistance 4 is substantially larger than the magnitude indicated by the slope of line *b*, the slope of line *c* being so chosen, with respect to the curvature of the characteristic D, that the cathode bias voltage $E_r$, represented graphically by the projection of line *c* on the voltage axis, decreases rapidly as the bias potential is increased negatively to shift line *c* towards the left.

As indicated in Fig. 2, the initial bias $e_g$ is the algebraic sum of the negative cathode bias $E_r$, the negative rectifier bias $E_c$ which is established across rectifier circuit resistance 8 by the space current for zero input voltage $E_o$, and the positive bias potential $E_b$ from the source 11.

As shown graphically in Fig. 2, the high cathode bias resistor 4 affects a susbtantial reduction in the net change in bias potential $e_g$ when, for small signal inputs less than the "normal" input, the rectifier bias $E_c$ increases with increasing signal strength. When the rectifier bias $E_c$ is numerically equal to the fixed bias $E_b$, the operating point *o'* is located by drawing through origin O, a line *c'* parallel to the line *c*. It will be noted that the cathode bias potential has dropped materially and therefore the net change in the gain control bias $e_g$ is substantially less than the change in the rectifier bias $E_c$.

The relationship between the cathode bias potential $E_r$, the rectifier bias potential $E_c$ and the gain control bias $E_g$, for increasing signal strength E, is illustrated in Fig. 4. For the particular gain control system from which the data were obtained, the decrease in cathode bias was somewhat less than the increase in rectifier bias for values of E less than normal input $e_m$, thus accounting for the fact that the control curve C, Fig. 1, is slightly lower than the inclined branch of the ideal control curve A. For somewhat greater values of signal input E, but little change in the cathode bias potential $E_r$ is produced by increasing rectifier potentials $E_c$, and therefore the curve $e_g$ is substantially parallel to the rectifier potential curve $E_c$.

One practical embodiment of the invention, as illustrated in Fig. 5, comprises a two-stage tetrode amplifier working into a diode rectifier. The input circuit of each tetrode amplifier 12 includes in series, the inductance 13, tuning condenser 14 and a blocking condenser 15 of 0.1 microfarad capacity.

A cathode resistance 16, by-passed for radiofrequency currents, is included in each amplifier circuit. The circuit of diode 17 comprises the tuned radio frequency impedance 18 in series with a resistance 19 of approximately 1 megohm which is by-passed for radio frequency by condenser 20. The audio frequency potential developed across resistance 19 may be passed to an audiofrequency amplifier, not shown, and the rectified direct current potential is passed, by lead 21 to the grid circuits of the amplifiers, resistances 22 of a half megohm being included to suppress audiofrequency components from the bias potentials passed to the amplifier grids. The positive bias potential necessary to reduce the high negative bias components, due to the no-load space current flow in the respective tubes, to the appropriate value for maximum sensitivity is supplied by a battery 23. The values stated are appropriate when the tetrodes are of the commercial 224 type and the diode is of the commercial 227 type, with grid and plate connected together.

It will be apparent that the use of two bias potentials which vary automatically with signal strength affords wide latitude in the design and construction of automatic gain control systems. While I have described one particular type of control, it will be apparent that the effects of changing cathode bias potential and changing rectifier potential may, if desired, be combined to produce control characteristics substantially different from that indicated by curve C of Fig. 1.

It is also apparent that the invention is not limited to systems in which the rectifier has the further function of demodulating the signals transmitted by the amplifier, or in which the rectifier input voltage is derived from the amplifier output.

I claim:—

1. The method of operation of an electrical wave amplifier so as to secure automatic gain control thereof, which comprises applying to said amplifier a gain control potential which varies automatically with the magnitude of the input of said amplifier and applying to said amplifier a second gain control potential which varies automatically as a function of said first gain control potential, said first gain control potential being substantially counteracted by changes in said second gain control potential for electrical waves having less than a predetermined magnitude.

2. In an electrical wave transmission system, the combination with an electron tube amplifier having input and output circuits, and means for automatically impressing upon said amplifier a gain control potential which varies in magnitude with changes in the magnitude of the electrical waves to be amplified, of means substantially preventing said automatic gain control potential from affecting the amplifier gain until the electrical waves increase in magnitude to a predetermined value, said last mentioned means including a cathode bias resistance metallically connected in the input circuit of said amplifier.

3. In an electrical wave transmission system, the combination with an electron tube amplifier, a rectifier, and means impressing upon said amplifier a gain control voltage derived from said rectifier by rectification of alternating currents traversing said system, of means impressing upon said amplifier a second gain control potential of a magnitude determined as a function of said first control voltage and operative conjointly therewith so as to prevent said first control voltage from being substantially effective until it reaches a predetermined value.

4. In an electrical wave amplifier, the combination with a vacuum tube and input and output circuits therefor, a rectifier and means impressing upon the input circuit thereof electrical waves varying in magnitude with the electrical wave input to said vacuum tube, and circuit elements associated with the rectifier for impressing upon said tube a gain control potential varying with rectifier output, of means in circlit with said tube for developing a second gain control potential which varies in magnitude with the gain control potential impressed thereon by said rectifier and operates conjointly therewith so as to prevent said first controlled voltage from being substantially effective until it reaches a predetermined value.

5. An electrical wave transmission system of the type including an amplifier and a rectifier for impressing upon said amplifier a control grid bias potential varying automatically with changes in the amplitude of the electrical waves impressed upon said amplifier, characterized by the fact that the cathode circuit of said amplifier includes a bias resistor across which the space current flow establishes a bias potential, said resistor having a magnitude such that for a predetermined range of amplifier input voltages the changes in cathode bias potential substantially offset changes in the rectifier bias potential.

6. In a carrier wave receiver, the combination with a carrier wave amplifier, a diode rectifier having input and output impedances associated therewith, means coupling the amplifier output circuit to the input impedance of said diode rectifier, and circuit elements for transferring back to said amplifier a gain control voltage developed across the output impedance of said diode rectifier, of a cathode bias resistor in said amplifier of such magnitude as substantially to postpone reduction in amplifier gain until said gain control voltage reaches a predetermined value.

7. In a carrier wave amplifier, the combination with an amplifier tube having unput and output circuits, a diode rectifier having an input circuit across which is developed a carrier voltage varying with received carrier wave voltages, of means operative in the absence of received carrier waves to bias said amplifier tube to maximum sensitivity, said means comprising circuit elements impressing upon the tube grid a negative potential derived from space current flow in said diode rectifier, a source of direct current potential impressing a positive potential upon said tube grid, and a cathode bias resistance common to said amplifier input and output circuits.

8. In combination, in a radio receiver, a high frequency amplifier, a self bias resistor arranged in the cathode circuit of said amplifier, said resistor having a magnitude such that it biases the control grid of the amplifier relatively more negative than the requirements of normal reception, a rectifier, means electrically asociated with said rectifier for developing an amplifier gain control potential which varies automatically with the magnitude of the input to said amplifier, means for applying the control potential to said control grid, and additional means for applying to said control grid a direct current potential opposed in sense to said self bias potential whereby the initial control grid bias is reduced to a value correct for said normal reception requirements.

9. In automatic volume control apparatus wherein two discrete potentials are employed to control amplifier gain, means whereby one of said discrete potentials is obtained by rectification of the amplifier output, means wehreby the second potential is derived from the space current flow in the cathode circuit of the amplifier, and additional means for opposing said second potential with a potential of opposite sign.

10. In automatic volume control apparatus wherein two discrete potentials are employed to control amplifier gain, means whereby one of said discrete potentials is obtained by rectification of the amplifier output, means whereby the second potential is derived from the space current flow in the cathode circuit of the amplifier, and additional means for opposing said second potential with a potential of positive sign.

11. In combination with a plurality of high frequency amplifiers, a rectifier, means connected between the input circuits of said amplifiers and said rectifier for applying to said amplifiers gain control potentials which vary automatically with the magnitude of the input to said rectifier, and a relatively high self bias resistor disposed in the space current path of each of said amplifiers, and means for opposing the bias voltage developed across each of said resistors with a predetermined positive voltage.

12. In electrical wave transmission system, the combination with an electron tube amplifier, a rectifier, and means impressing upon said amplifier a gain control voltage derived from said rectifier by rectification of alternating currents traversing said system, of means impressing upon said amplifier a second gain control potential of a magnitude determined as a function of said first control voltage and operative conjointly therewith so as to prevent said first control voltage from being substantially effective until it attains a predetermined value, said last named means including a resistor connected in the cathode circuit of said amplifier and a source of positive potential connected to said resistor in a sense such that the voltage developed across the resistor is opposed.

13. In a radio receiver, a tuned radio frequency amplifier provided with at least a cathode, control grid and anode, a detector following said amplifier including at least a cathode and a cold electrode, a resistor connected between the cold electrode and cathode of said detector, a direct current connection connected between a point of negative direct current potential on said resistor and the control grid of said amplifier, a grounded resistor connected in the cathode circuit of said amplifier, a potential source having its negative terminal grounded, and a connection between said detector resistor and the point on said potential source which is positive with respect to ground.

14. In a receiver as defined in claim 13, a tuning condenser connected between the control grid and cathode of said amplifier, a tuning condenser connected between said cathode and said cold electrode, and at least one additional tuned radio frequency amplifier connected between said first amplifier and said detector.

15. In a receiver as defined in claim 13, at least one resistor in said direct current connection for blocking the flow of radio frequency current from said detector resistor to the control grid circuit of said amplifier.

16. In a receiver as defined in claim 13, said detector being of the diode type.

ALFRED W. BARBER